United States Patent
Jeong et al.

(10) Patent No.: US 8,923,081 B2
(45) Date of Patent: Dec. 30, 2014

(54) SEMICONDUCTOR MEMORY SYSTEM AND OPERATING METHOD THEREOF

(71) Applicant: SK hynix Inc., Gyeonggi-do (KR)

(72) Inventors: Chun-Seok Jeong, Gyeonggi-do (KR); Jae-Jin Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 13/830,166

(22) Filed: Mar. 14, 2013

(65) Prior Publication Data
US 2014/0169112 A1 Jun. 19, 2014

(30) Foreign Application Priority Data
Dec. 13, 2012 (KR) .......................... 10-2012-0145329

(51) Int. Cl.
*G11C 7/00* (2006.01)

(52) U.S. Cl.
CPC ........................................ *G11C 7/00* (2013.01)
USPC ................................ 365/191; 365/63; 365/51

(58) Field of Classification Search
USPC .............. 365/191, 63, 51, 198; 711/147–149, 711/170
See application file for complete search history.

(56) References Cited

U.S. PATENT DOCUMENTS 7,948,812 B2 * 5/2011 Ware ......................... 365/189.15
8,261,039 B2 * 9/2012 Perego et al. ................. 711/170

* cited by examiner

*Primary Examiner* — David Lam
(74) *Attorney, Agent, or Firm* — IP & T Group LLP

(57) ABSTRACT

A semiconductor memory system configured to exchange signals through channels may include a memory control device configured to have a plurality of channels, a plurality of memory devices configured to be connected to each of the plurality of channels, wherein the plurality of channels share at least one of the plurality of memory devices.

18 Claims, 4 Drawing Sheets

SEMICONDUCTOR MEMORY SYSTEM AND OPERATING METHOD THEREOF

CROSS-REFERENCE TO RELATED APPLICATIONS

The present application claims priority of Korean Patent Application No. 10-2012-0145329 filed on Dec. 13, 2012, which is incorporated herein by reference in its entirety.

BACKGROUND

1. Field

Exemplary embodiments of the present invention relate to a semiconductor design technology, and more particularly, to a semiconductor memory system exchanging signals through a channel and an operating method thereof.

2. Description of the Related Art

Semiconductor devices including a double data rate synchronous DRAM (DDR SDRAM) are being developed in various directions in order to meet users' demands, and development of package technologies of a semiconductor device is also in progress. Recently, a multi-chip package (MCP) has been proposed as one of the package technologies. According to the multi-chip package, a plurality of semiconductor chips are packaged to configure a single chip, wherein it is possible to increase a memory capacity with a storage function of the memory chips or to improve a desired performance with various non-storage function of the semiconductor chips. Multi-chip packages may be classified into a single layer-type multi-chip package and a multi-layer-type multi chip package according to the configuration thereof. In the single layer-type multi-chip package, a plurality of semiconductor chips are disposed side by side on a plane. In the multi-layer-type multi-chip package, a plurality of semiconductor chips that are stacked perpendicularly.

When a plurality of semiconductor chips are implemented as a multi-layer-type multi-chip package, the input/output terminals of each semiconductor chip were implemented by wire bonding in the past, However, when the wire bonding is used, a chip implemented thereby may have flaws in a high-speed operation and noises. Recently, a chip-on-chip package technology has been used in place of the wire bonding.

According to the chip-on-chip package technology, each of the semiconductor chips has bump pads whose disposition of all of the semiconductor chips is identical, and thus the semiconductor chips may be perpendicularly stacked and connected to each other with the bumps of same disposition. When such a chip-on-chip package technology is used, it is possible to achieve a high-speed operation, and also to reduce power consumption. In addition, the chip-on-chip package technology may minimize the entire area of a multi-chip package, so that the chip-on-chip package technology is one of recently highlighted technologies.

FIG. 1 is a block view illustrating a conventional semiconductor memory system.

Referring to FIG. 1, a semiconductor memory system includes a memory control device 110 and a plurality of memory devices 121 to 124.

The memory control device 110 transfers/receives various signals with the plurality of memory devices 121 to 124, wherein the signals may include, for example, a command, an address, data, and the like. The memory control device 110 has channels to transfer/receive such signals. Hereinafter, for convenience of description, it is assumed as an example that the memory control device 110 has a first channel 111 and a second channel 112, each of which has 2n number of transmission lines (here, n is a natural number). In addition, a first memory device 121 and a second memory device 122 are controlled by the memory control device 110, and each of the first and second memory devices is connected to n number of transmission lines included in the first channel 111. A third memory device 123 and a fourth memory device 124 are also controlled by the memory control device 110, and each of the third and fourth memory devices is connected to n number of transmission lines included in the second channel 112.

Meanwhile, in response to an input for desired operation from a user to the memory control device 110, the memory control device 110 controls the plurality of memory devices 121 to 124. In this case, the memory control device 110 determines a signal transfer bandwidth and selects and activates appropriate channel. That is to say, according to the control of the memory control device 110, it can be set to use both first and second channels 111 and 112, or to use only any one of the first and second channels 111 and 112. In addition, the signal transfer bandwidth of an activated channel can be set to "n" or "2n".

However, when the signal transfer bandwidth of each channel to is set to "n", that is to say, when only any one memory device of the first and second memory devices 121 and 122 is used, and only one memory device of the third and fourth memory devices 123 and 124 is used, the utilization efficiency of memory devices to an area occupied by the first to fourth memory devices 121 to 124 drops to 50% or less.

FIG. 2 is a block view illustrating another example of a conventional semiconductor memory system.

Referring to FIG. 2, a semiconductor memory system includes a memory control device 210, and a plurality of memory devices 220. The semiconductor memory system of FIG. 2 is different from that of FIG. 1 in the number of the plurality of memory devices 220. That is to say, FIG. 2 illustrates a case where two memory devices, i.e. a first memory device 221 and a second memory device 222, are included. Here, the first memory device 221 is connected to 2n number of transmission lines included in a first channel 211, and the second memory device 222 is connected to 2n number of transmission lines included in a second channel 212.

Similarly to FIG. 1, the memory control device 210 determines a signal transfer bandwidth, and selects and activates one of the first and second channels 211 and 212 according to an input for desired operation from a user. However, when the signal transfer bandwidth of each channel is set to "n", only "n" number of transmission lines among 2n number of transmission lines connected to the first memory device 221 are used, and only "n" number of transmission lines among 2n number of transmission lines connected to the second memory device 222 are used, the first and second memory devices 221 and 22 must be both activated, so that the power consumption of memory devices to a signal transfer bandwidth may increase.

SUMMARY

Various embodiments are directed to provide a semiconductor memory system in which a plurality of channels may share transmission lines connected to a memory device.

Also, various embodiments are directed to provide an operating method of a semiconductor memory system that transfers/receives signals with a memory device via a plurality of channels with shared transmission lines.

In an embodiment, a semiconductor memory system includes a memory control device configured to have a plurality of channels, a plurality of memory devices configured to be connected to each of the plurality of channels. The plurality of channels share at least one of the plurality of memory devices.

Preferably, a shared memory device of the plurality of memory devices may be connected to the plurality of channels through a common transmission line.

In an embodiment, an operating method of a semiconductor memory system includes setting signal transfer bandwidths of first and second channels, allocating a common memory device to the first and second channels according to a result of the setting, and allowing the memory control device and the plurality of memory devices including the common memory device to perform signal transfer/receive operations through the first and second channels according to the signal transfer bandwidths.

Preferably, the method may further include determining whether the plurality of memory devices are to be activated depending on a result of the setting.

In an embodiment, a semiconductor memory system includes a plurality of memory devices configured to be connected to a plurality of channels, respectively, a common memory device configured to be connected to the plurality of channels and to share the channels, and a memory control device configured to transfer/receive signals with the plurality of memory devices and the common memory device through the plurality of channels, and to have a control line for controlling whether to activate the common memory device.

Preferably, the memory control device may include an activation control unit configured to output an activation signal through the control line in response to signal transfer bandwidths of the plurality of channels.

In an embodiment, semiconductor memory system includes a plurality of memory devices including at least one dedicated memory device and at least one common memory device, and a memory control device configured to transfer/receive a signal with at least one of the plurality of memory devices via at least one of a plurality of channels, wherein each of the plurality of channels has dedicated transmission lines connected to the dedicated memory device and shared transmission lines connected to the common memory device, and the shared transmission lines are shared by at least two of the plurality of channels.

In an embodiment, an operating method of a semiconductor memory system, includes setting signal transfer bandwidth of a plurality of channels, allocating at least one of a plurality of memory devices including at least one dedicated memory device and at least one common memory device to the plurality of channels according to the signal transfer bandwidth of a plurality of channels, and performing signal transfer/receive with the allocated memory device, wherein each of the plurality of channels has dedicated transmission lines connected to the dedicated memory device, and shared transmission lines connected to the common memory device, and the shared transmission lines are shared by at least two of the plurality of channels.

A semiconductor memory system according to an embodiment of the present invention enables a plurality of channels to share transmission lines connected to a common memory device, and enables signal transfer/receive between a memory control device and the common memory device via a plurality of channels with shared transmission lines.

DETAILED DESCRIPTION

Figure 1:
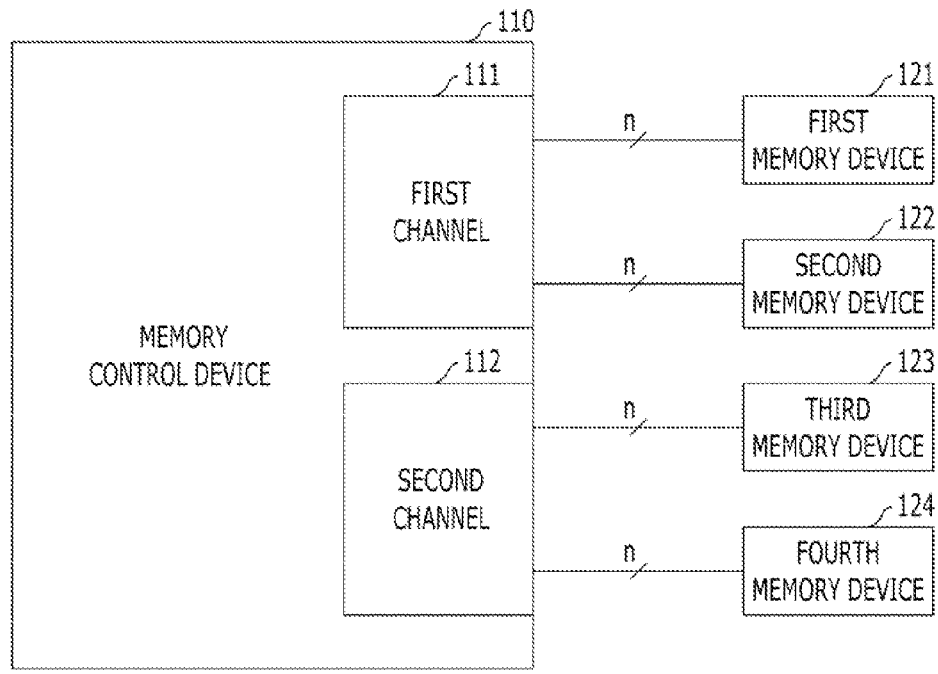
FIG. 1 is a block view illustrating a conventional semiconductor memory system.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3A:
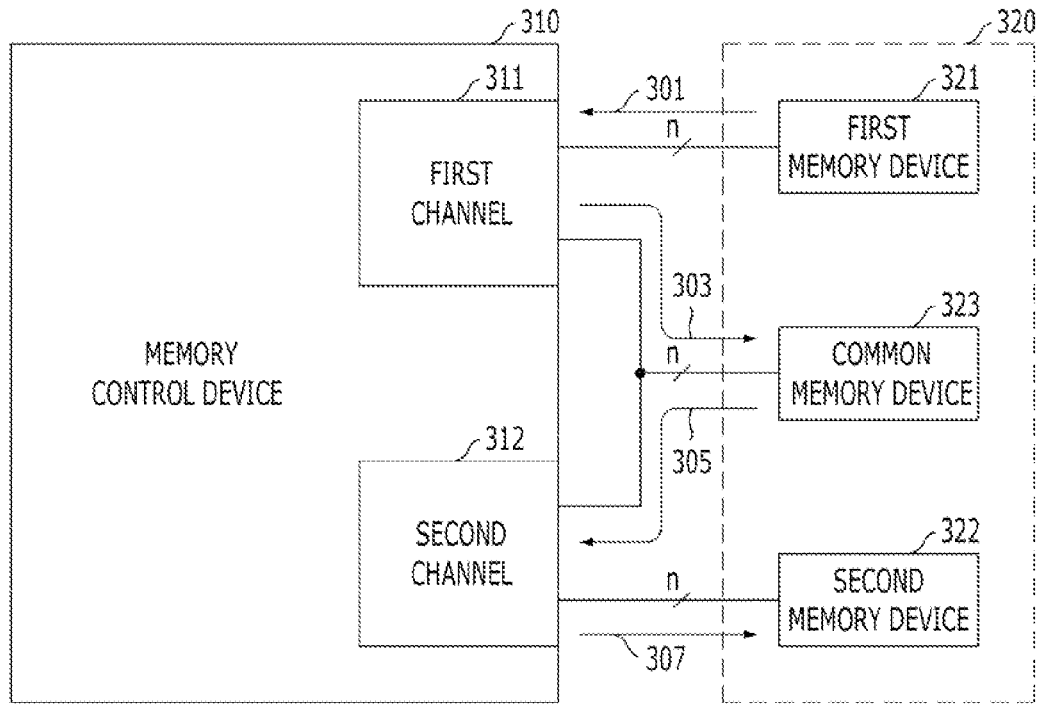
FIGS. 3A to 3C are a block views illustrating a semiconductor memory system according to an embodiment of the present invention.
Figure 3B:
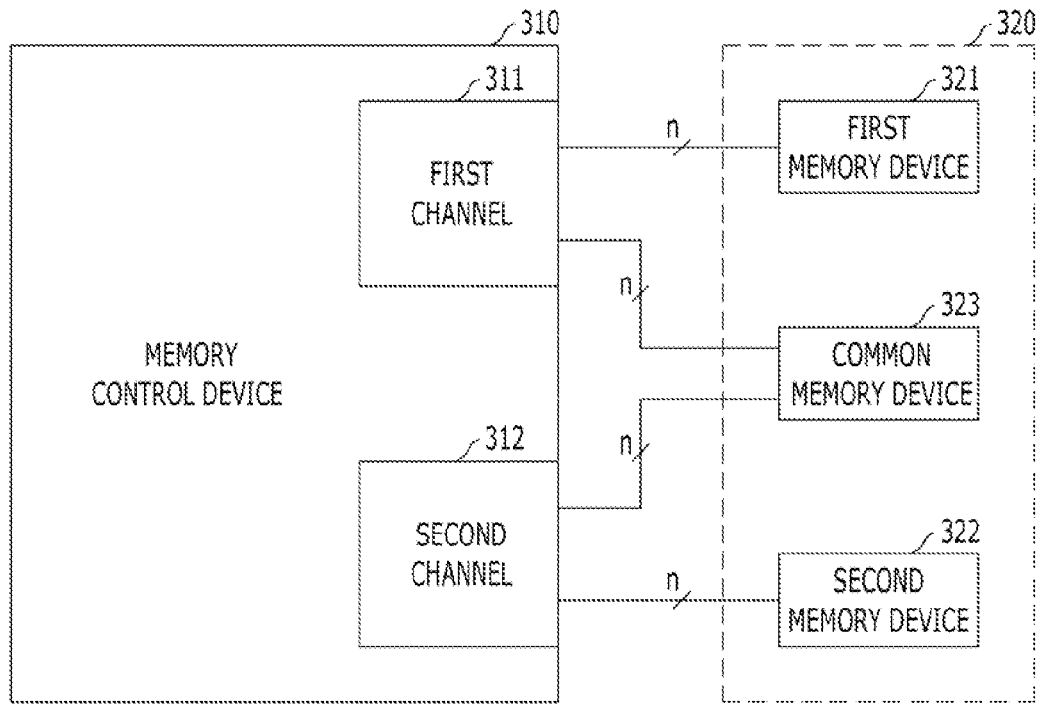

FIGS. 3A and 3B are a block view illustrating a semiconductor memory system according to an embodiment of the present invention.

Referring to FIG. 3A, a semiconductor memory system includes a memory control device 310 and a plurality of memory devices 320.

Figure 2:
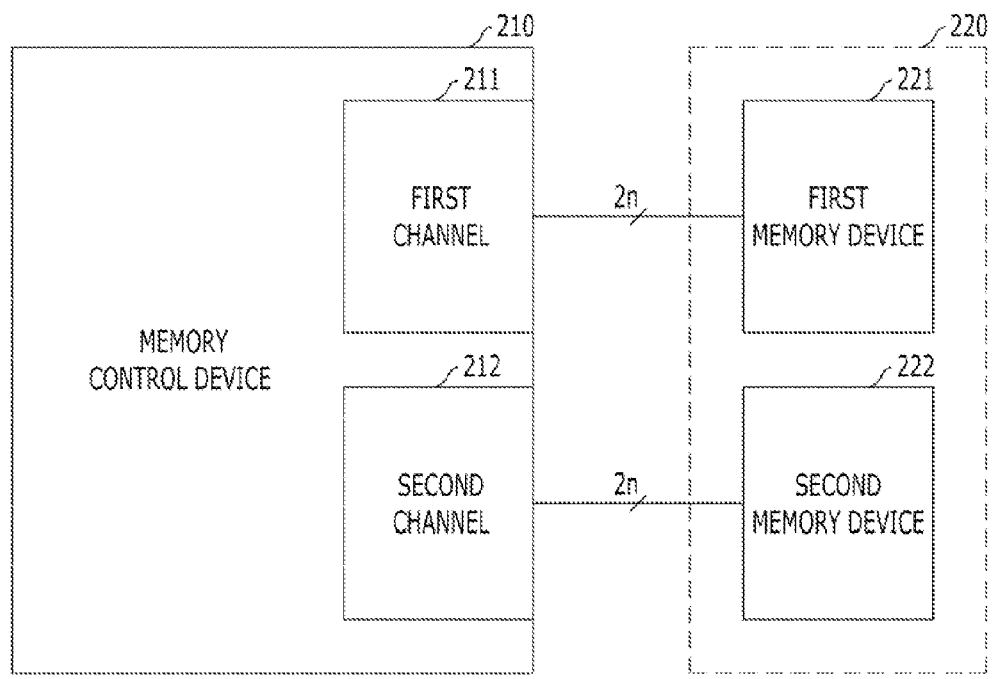
FIG. 2 is a block view illustrating another example of a conventional semiconductor memory system.

The memory control device 310 transfers/receives various signals with the plurality of memory devices 320, wherein the signals may include, for example, a command, an address, data, and the like. The memory control device 310 has plural channels to transfer/receive such signals with the plurality of memory devices 320. Hereinafter for convenience of description, it is assumed as an example that the memory control device 310 has a first channel 311 and a second channel 312, each of which has a maximum signal transfer bandwidth of 2n number of transmission lines (here, n is a natural number), as the conventional technique illustrated in FIGS. 1 and 2. However, a first memory device 321 is connected to n number of transmission lines among 2n number of transmission lines included in the first channel 311 to transfer/receive signals with the memory control device 310, and a second memory device 322 is connected to n number of transmission lines among 2n number of transmission lines included in the second channel 312 to transfer/receive signals with the memory control device 310.

The first and second channel 311 and 312 share remaining n number of transmission lines connected to a common memory device 323 to transfer/receive signals with the memory control device 310. Here, the remaining n number of transmission lines included in the first channel 311 may be connected in common to the remaining n number of transmission lines among the 2n number of transmission lines included in the second channel 312, and thus each of the first channel 311 and the second channel 312 has the maximum signal transfer bandwidth of 2n number of transmission lines.

Figure 3C:
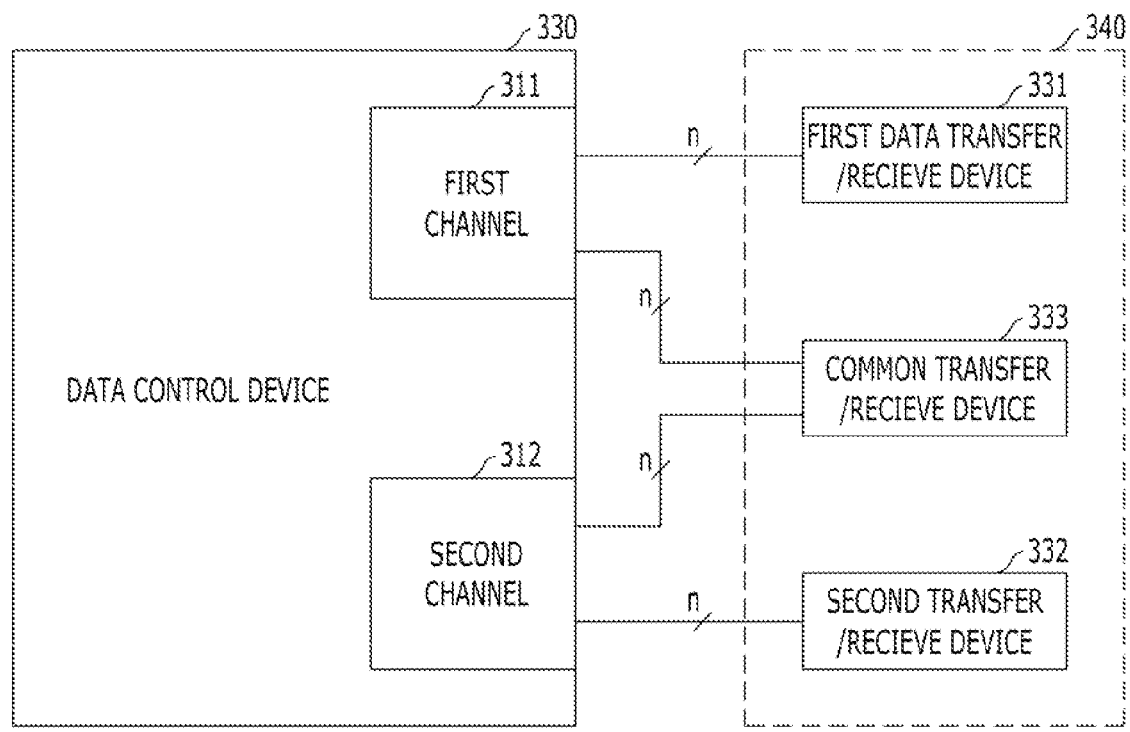
Figure 4:
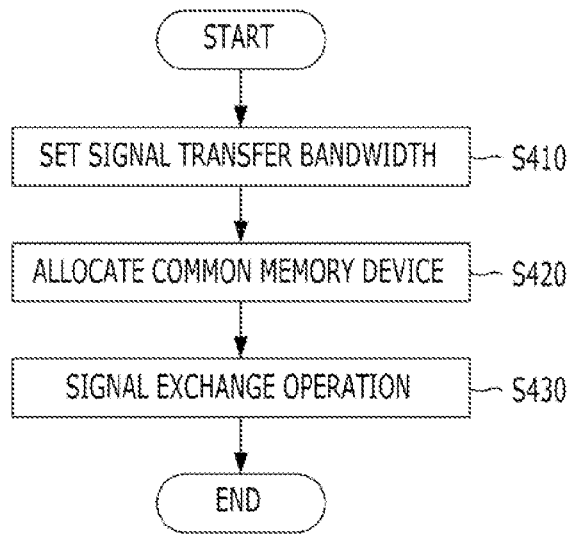
FIG. 4 is a flowchart illustrating the operating method of the semiconductor memory system shown in FIGS. 3A to 3C.

An embodiment of the present invention is described with respect to n number of transmission lines as an example, wherein the n number of transmission lines represents the maximum signal transfer bandwidths of the first memory device 321, the second memory device 322, and the common memory device 323. They may be varied depending on designs. In another embodiment of the present invention, the maximum signal transfer bandwidth of the common memory device 323 may be set to 2n in number, which means that the number of transmission lines connected to the common memory device 323 and shared by the first and second channels 311 and 312 is 2n in number and thus the maximum signal transfer bandwidth of the first and second channels 311 and 312 may be 3n in number. In addition, Referring to FIG. 3B, it is possible to independently design a part of signal transmission lines connected between the first memory device 321 and common memory device 323, and of transmission lines connected between the second memory device 322 and the common memory device 323. Furthermore, FIG. 3C is a block view illustrating a semiconductor system according to an embodiment of the present invention. Referring to FIG. 3C, a semiconductor system includes a data control device 330 and a plurality of data transfer/receive devices 331 to 332. A data control device 330 has a plurality of channels. A plurality of data transfer/receive devices 340 are connected to each of the plurality of channels. The plurality of channels share at least one of the plurality of data transfer/receive devices 340. A shared data transfer/receive device of the plurality of data transfer/receive devices is connected to the plurality of channels through a common transmission line. The common transmission line comprises a part of multiple transmission lines of each of the plurality of channels. The plurality of channels comprises a first channel and a second channel and the plurality of devices comprises a first data transfer/receive device 331 and a second data transfer/receive device 332. The first transfer/receive device 331 is connected to a part of multiple transmission lines of the first channel 311 and to transfer/receive signals to/from the data control device 330. The second transfer/receive device 332 is connected to a part of multiple transmission lines of the second channel 312 and to transfer/receive signals to/from the data control device 330, A common data transfer/receive device 33 is connected to remaining transmission lines of the first and second channels 311 and 312 and transfers/receives signals to/from the data control device 330. The remaining transmission lines of the first channel 311 and the remaining transmission lines of the second channel 312 are respectively connected to each other through common transmission lines. The signal is directly transferred from the first channel to the second channel 312. The memory control device 310 transfers/receives various signals with the plurality of memory devices 320. FIG. 4 is a flowchart explaining the operating method of the semiconductor memory system of FIGS. 3A and 3B.

Referring to FIGS. 3A, 3B and 4, the operating method of the semiconductor memory system includes step S410 of setting a signal transfer bandwidth, step S420 of allocating a common memory device, and step S430 of performing a signal transfer/receive operation.

Before a signal transfer/receive operation between the memory control device 310 and the plurality of memory devices 320 is performed, whether or not the first and second channels 311 and 312 are to be activated is set and the signal transfer bandwidths of the first and second channels 311 and 312 are set in step S410. For example, the signal transfer bandwidth of the first channel 311 may be set to n in number, and signal transfer bandwidth of the second channel 312 may be set 2n in number. In step S420, the common memory device 323 is allocated to corresponding channels according to the signal transfer bandwidth set by the step S410. Since the signal transfer bandwidth of the second channel 312 is set to 2n in number, the common memory device 323 is allocated to the second channel 312. Thereafter, a signal transfer/receive operation is performed in step S430, wherein the memory control device 310 performs a signal transfer/receive operation with the first memory device 321 through n number of transmission lines of the first channel 311 and performs a signal transfer/receive operation with the second memory device 322 and common memory device 323 through 2n number of transmission lines of the second channel 312.

When the signal transfer bandwidths of the first and second channels 311 and 312 are set to n in number respectively, one of the first and second memory devices 321 and 322 and the common memory device 323 may be shifted to a power-down mode or self-refresh mode, so that power consumption may be reduced.

In the semiconductor memory system according to an embodiment of the present invention, it is possible to vary the signal transfer bandwidths of the first and second channels 311 and 312 included in the memory control device 310, so that it is possible to increase the utilization efficiency and to reduce power consumption in comparison with the conventional configuration.

Referring back to FIGS. 3A and 3B, the semiconductor memory system according to an embodiment of the present invention may transfer, for example, data stored in the first memory device 321 to the second memory device 322, which may be achieved through a sequential data transfer/receive, such as sequence of 301, 303, 305, and 307 shown in FIGS. 3A and 3B.

That is to say, as the data transfer/receive sequence 301, the memory control device 310 receives data information from the first memory device 321 through n number of transmission lines of the first channel 311. As the data transfer/receive sequence 303, the data information transferred through the n number of transmission lines of the first channel 311 is transferred to the common memory device 323. Thereafter, as the data transfer/receive sequence 305, the memory control device 310 receives data information stored in the common memory device 323 through n number of transmission lines of the second channel 312. Finally, as the data transfer/receive sequence 307, the data information is transferred to the second memory device 322 through n number of transmission lines of the second channel 312.

As described above, the semiconductor memory system may perform sequential data transfer/receive, such as sequence of 301, 303, 305, and 307, according to the control of the memory control device 310. In addition, it is possible to perform a direct signal transfer/receive from the first channel 311 to the second channel 312, without passing through the common memory device 323, according to the control of the memory control device 310.

The semiconductor memory system according to an embodiment of the present invention enables a data transfer/receive operation between memory devices connected to different channels, which means that a data transfer/receive operation may be more efficiently and rapidly performed.

Figure 5:
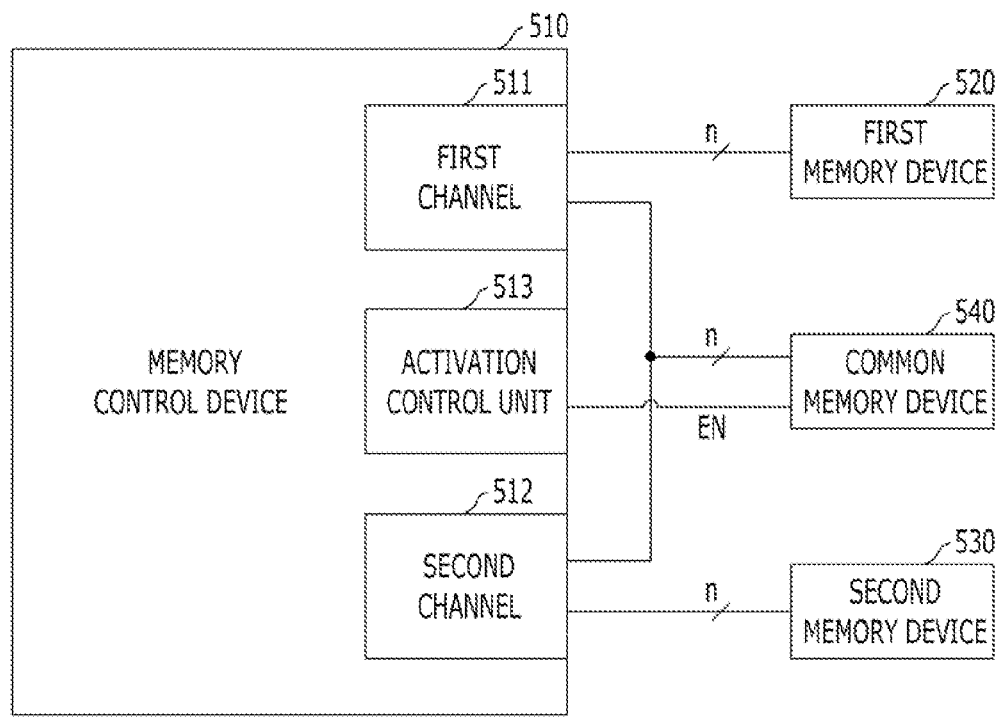
FIG. 5 is a block view illustrating a semiconductor memory system according to another embodiment of the present invention.

FIG. 5 is a block view illustrating a semiconductor memory system according to another embodiment of the present invention.

Referring to FIG. 5, a semiconductor memory system includes a memory control device 510, first and second memory devices 520 and 530, and a common memory device 540, wherein the memory control device 510 includes an activation control unit 513, as well as first and second channels 511 and 512. The configuration, except for the configuration associated with the activation control unit 513, has been described with reference to FIG. 3A, so a description thereof will be omitted.

The activation control unit 513 controls whether or not the common memory device 540 is to be activated. The activation control unit 513 generates an activation signal EN based on the signal transfer bandwidths of the first and second channels 511 and 512, and transfers the activation signal to the common memory device 540. The common memory device 540 may be activated or inactivated in response to the transferred activation signal EN.

In the semiconductor memory system according to an embodiment of the present invention, when it is desired to use 2n number of signal transfer bandwidths in any one of the first and second channels 511 and 512, the activation operation of the common memory device 540 may be controlled using an activation signal EN. In this case, the activation signal EN may be transferred through a transmission line other than the shared transmission lines, which means that the area of a shared transmission lines may be minimized.

As described above, the semiconductor memory system according to an embodiment of the present invention enables a plurality of channels to share transmission lines connected to a common memory device, and enables memory devices connected to mutually different channels to transfer/receive signals. In addition, since different channels share memory devices and transfer/receive signals, it is possible to optimize the operation efficiency and power consumption of a semiconductor memory system.

Although various embodiments have been described for illustrative purposes, it will be apparent to those skilled in the art that various changes and modifications may be made without departing from the spirit and scope of the invention as defined in the following claims,

What is claimed is:

1. A semiconductor system comprising:
a data control device configured to have a plurality of channels;
a plurality of data transfer/receive devices configured to be connected to each of the plurality of channels including a first channel and a second channel,
wherein the plurality of channels share at least one of the plurality of data transfer/receive devices,
wherein the plurality of data transfer/receive devices comprises:
a first transfer/receive device configured to be connected to a part of multiple transmission lines of the first channel and to transfer/receive signals to/from the data control device;
a second transfer/receive device configured to be connected to a part of multiple transmission lines of the second channel and to transfer/receive signals to/from the data control device; and
a common data transfer/receive device configured to be connected to a rest of the transmission lines of the first and second channels and to transfer/receive signals to/from the data control device.

2. The system of claim 1, wherein a shared data transfer/receive device of the plurality of data transfer/receive devices is connected to the plurality of channels through a common transmission line.

3. The system of claim 2, wherein the common transmission line comprises a part of multiple transmission lines of each of the plurality of channels.

4. The system of claim 1, wherein the rest of the transmission lines of the first channel and the rest of the transmission lines of the second channel are respectively connected to each other through common transmission lines.

5. The system of claim 1, wherein the signal is directly transferred from the first channel to the second channel.

6. The system of claim 1, wherein the data control device is a memory control device and the plurality of data transfer/receive devices are a plurality of memory device.

7. The system of claim 6, wherein a shared memory device of the plurality of memory devices is connected to the plurality of channels through a common transmission line.

8. The system of claim 7, wherein the common transmission line comprises a part of multiple transmission lines of each of the plurality of channels.

9. The system of claim 6, wherein the plurality of channels comprises a first channel and a second channel and the plurality of memory devices comprises a first memory device and a second memory device.

10. The system of claim 9, further comprising:
the first memory device configured to be connected to a part of multiple transmission lines of the first channel and to transfer/receive signals to/from the memory control device;
the second memory device configured to be connected to a part of multiple transmission lines of the second channel and to transfer/receive signals to/from the memory control device; and
a common memory device configured to be connected to a rest of the transmission lines of the first and second channels and to transfer/receive signals to/from the memory control device.

11. The system of claim 10, wherein the rest of the transmission lines of the first channel and the rest of the transmission lines of the second channel are respectively connected to each other through common transmission lines.

12. The system of claim 10, wherein the signal is directly transferred from the first channel to the second channel.

13. An operating method of a semiconductor memory system, comprising:
setting signal transfer bandwidths of first and second channels;
allocating a common memory device to the first and second channels according to a result of the setting; and
allowing the memory control device and the plurality of memory devices including the common memory device to perform signal transfer/receive operations through the first and second channels according to the signal transfer bandwidths,
wherein the plurality of memory devices comprises:
a first memory device is connected to a part of multiple transmission lines of the first channel and transfers/receives signals to/from the memory control device; and
a second memory device is connected to a part of multiple transmission lines of the second channel and transfers/receives signals to/from the memory control device; and
wherein the common memory device is connected to a rest of the transmission lines of the first and second channels and transfers/receives signals to/from the memory control device.

14. The method of claim 13, further comprising determining whether the plurality of memory devices are to be activated depending on a result of the setting.

15. The method of claim 13, further comprising setting whether the first and second channels are to be activated.

16. The method of claim 13, wherein the common memory device performs a signal transfer/receive operation to/from one of the first and second channels.

17. A semiconductor memory system comprising:
- a plurality of memory devices including a first memory device and a second memory device configured to be connected to a plurality of channels including a first channel and a second channel, respectively;
- a common memory device configured to be connected to the plurality of channels and to share the channels; and
- a memory control device configured to transfer/receive signals to/from the plurality of memory devices and the common memory device through the plurality of channels, and to have a control line for controlling whether to activate the common memory device,
- wherein the first memory device is connected to a part of multiple transmission lines of the first channel and transfers/receives signals to/from the memory control device;
- wherein the second memory device is connected to a part of multiple transmission lines of the second channel and transfers/receives signals to/from the memory control device; and
- wherein the common memory device is connected to a rest of the transmission lines of the first and second channels and transfers/receives signals to/from the memory control device.

18. The system of claim 17, wherein the memory control device comprises an activation control unit configured to output an activation signal through the control line in response to signal transfer bandwidths of the plurality of channels.

* * * * *